(12) United States Patent
Lee et al.

(10) Patent No.: US 12,501,676 B2
(45) Date of Patent: Dec. 16, 2025

(54) SILICON CARBIDE SUBSTRATE OR SUBSTRATE PROCESSING METHOD

(71) Applicant: National Central University, Taoyuan (TW)

(72) Inventors: Tien-Hsi Lee, Tao-Yuan (TW);
Chun-Huang Wu, Tao-Yuan (TW);
Yu-Sheng Chiou, Tao-Yuan (TW);
Shu-Cheng Li, Tao-Yuan (TW);
Wei-Chi Huang, Tao-Yuan (TW);
Yu-Tang Lin, Tao-Yuan (TW)

(73) Assignee: National Central University, Taoyuan (TW)

( * ) Notice: Subject to any disclaimer, the term of this patent is extended or adjusted under 35 U.S.C. 154(b) by 298 days.

(21) Appl. No.: 17/975,646

(22) Filed: Oct. 28, 2022

(65) Prior Publication Data

US 2024/0055487 A1   Feb. 15, 2024

(30) Foreign Application Priority Data

Aug. 12, 2022  (TW) .................................. 111130324

(51) Int. Cl.
*H10D 62/832* (2025.01)
*B23K 26/36* (2014.01)
(Continued)

(52) U.S. Cl.
CPC ......... *H10D 62/8325* (2025.01); *B23K 26/36* (2013.01); *B23K 26/362* (2013.01);
(Continued)

(58) Field of Classification Search
CPC ........... H01L 29/1608; H01L 21/02378; H01L 21/304; H01L 21/3212; H01L 21/306; C25D 11/022; C25D 11/32
See application file for complete search history.

(56) References Cited

U.S. PATENT DOCUMENTS

| | | | | |
|---|---|---|---|---|
| 5,227,034 A | * | 7/1993 | Stein | ................... H01L 21/0475 257/E21.06 |
| 7,722,441 B2 | * | 5/2010 | Goela | ................... C23C 16/345 451/63 |

(Continued)

FOREIGN PATENT DOCUMENTS

| | | | | |
|---|---|---|---|---|
| CN | 110197789 A | * | 9/2019 | ....... H01L 21/30625 |
| TW | 202046395 A | | 12/2020 | |

OTHER PUBLICATIONS

CN 110197789 A—English machine translation "Ultrasonic-assisted Electrochemical Mechanical Polishing Processing Device and Method of SiC Single Crystal Wafer" Sep. 3, 2019, Li, Shu-juan et al. (Year: 2019).*

*Primary Examiner* — Anita K Alanko

(57) ABSTRACT

A substrate processing method includes providing a substrate, wherein the substrate has a surface and a bottom surface opposite to each other, the substrate is defined with a predetermined area, the predetermined area is defined with a predetermined reaction part, and the predetermined reaction part extends from the surface toward the bottom surface of the substrate; performing a anodization reaction on the predetermined reaction part by an electrochemical method to convert the predetermined reaction part into a weakened layer, wherein the weakened layer has a thickness; and removing the weakened layer so that the substrate in the predetermined area has an exposed surface.

18 Claims, 7 Drawing Sheets

```
providing a substrate, wherein the substrate has a surface
and a bottom surface opposite to each other, the substrate
  is defined with a predetermined area, the predetermined       ~ S1
  area is defined with a predetermined reaction part, and
  the predetermined reaction part extends from the surface
         toward the bottom surface of the substrate
```

```
  performing an anodization reaction on the predetermined
  reaction part by an electrochemical method to convert the    ~ S2
  predetermined reaction part into a weakened layer, wherein
          the weakened layer has a thickness
```

```
  removing the weakened layer so that the substrate in the     ~ S3
        predetermined area has an exposed surface
```

(51) Int. Cl.
*B23K 26/362* (2014.01)
*C25D 11/02* (2006.01)
*C25D 11/32* (2006.01)
*H01L 21/02* (2006.01)
*H01L 21/304* (2006.01)
*H01L 21/306* (2006.01)
*H01L 21/321* (2006.01)

(52) U.S. Cl.
CPC ............ *C25D 11/022* (2013.01); *C25D 11/32* (2013.01); *H01L 21/02378* (2013.01); *H01L 21/304* (2013.01); *H01L 21/306* (2013.01); *H01L 21/30625* (2013.01); *H01L 21/3212* (2013.01)

(56) References Cited

U.S. PATENT DOCUMENTS

| | | | |
|---|---|---|---|
| 2008/0146004 A1 | 6/2008 | Matocha et al. | |
| 2009/0104753 A1* | 4/2009 | Honda | G02B 3/00 |
| | | | 257/E21.52 |
| 2013/0280887 A1* | 10/2013 | Ricolcol | H01L 21/76259 |
| | | | 438/460 |
| 2018/0047614 A1 | 2/2018 | Usenko | |
| 2020/0006074 A1* | 1/2020 | Cannara | C25F 3/12 |
| 2020/0286730 A1* | 9/2020 | Moder | H01L 21/467 |
| 2020/0365385 A1* | 11/2020 | Goller | H01L 21/3065 |

\* cited by examiner

```
┌─────────────────────────────────────────────────┐
│ providing a substrate, wherein the substrate has a surface │
│ and a bottom surface opposite to each other, the substrate │
│  is defined with a predetermined area, the predetermined   │
│  area is defined with a predetermined reaction part, and   │── S1
│ the predetermined reaction part extends from the surface   │
│      toward the bottom surface of the substrate            │
└─────────────────────────────────────────────────┘
                         │
                         ▼
┌─────────────────────────────────────────────────┐
│   performing an anodization reaction on the predetermined  │
│ reaction part by an electrochemical method to convert the  │── S2
│ predetermined reaction part into a weakened layer, wherein │
│           the weakened layer has a thickness               │
└─────────────────────────────────────────────────┘
                         │
                         ▼
┌─────────────────────────────────────────────────┐
│ removing the weakened layer so that the substrate in the   │── S3
│        predetermined area has an exposed surface           │
└─────────────────────────────────────────────────┘
```

FIG. 1

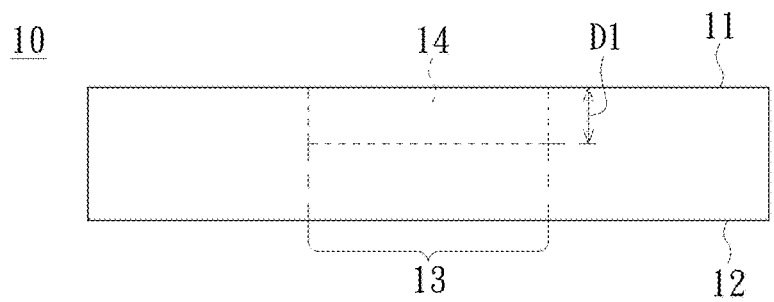

FIG. 2A

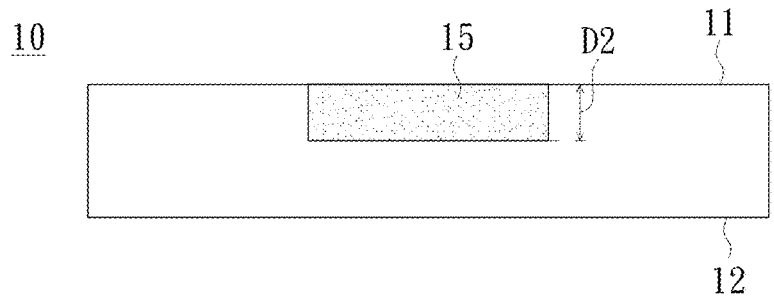

FIG. 2B

SILICON CARBIDE SUBSTRATE OR SUBSTRATE PROCESSING METHOD

FIELD OF THE INVENTION

The present invention relates to a substrate processing method, and more particularly to a silicon carbide substrate processing method.

BACKGROUND OF THE INVENTION

In response to the rise of technologies such as 5G communication and autonomous guided vehicles, silicon carbide materials are used as substrates for semiconductor components with the advantages of high efficiency, energy savings, high voltage, high current, and high power. In general, the requirement of the substrate thickness of semiconductor components is 100-200 microns. The hardness of silicon carbide substrates is high, whose Knoop hardness (HK) is approximately 2150-2900 MPa, while the abrasive particles generally used for grinding conventional silicon substrates are mostly $SiO_2$, whose hardness is approximately 200-500 MPa. Thus, it is not easy to thin silicon carbide substrate even if the abrasive particles $Al_2O_3$ (hardness is approximately 2000-2050 MPa) commonly used in grinding high-hardness materials are used. Therefore, diamond (hardness is 7000 MPa) is used as abrasive particles to thin the silicon carbide in the prior art which is very expensive. In addition, the feature of silicon carbide is prone to break, and the hard cutting process is prone to introduce high stress on the silicon carbide substrate, resulting in microcracks and material fragmentation. In addition, high residual stress may even be generated, causing the wafer to warp.

SUMMARY OF THE INVENTION

The present invention provides a substrate processing method, including providing a substrate, wherein the substrate has a surface and a bottom surface opposite to each other, the substrate is defined with a predetermined area, the predetermined area is defined with a predetermined reaction part, and the predetermined reaction part extends from the surface toward the bottom surface of the substrate; performing an anodization reaction on the predetermined reaction part by an electrochemical method to convert the predetermined reaction part into a weakened layer, wherein the weakened layer has a thickness; and removing the weakened layer so that the substrate in the predetermined area has an exposed surface.

In an embodiment of the present invention, the material of the substrate is silicon carbide.

In an embodiment of the present invention, the electrochemical method is anodization.

In an embodiment of the present invention, a thickness of the weakened layer is controlled by the amount of input charge when the anodization is performed.

In an embodiment of the present invention, the predetermined reaction part contacts an electrolyte solution during the anodization, and the electrolyte solution includes fluorine ions.

In an embodiment of the present invention, the electrolytic solution is a hydrofluoric acid solution.

In an embodiment of the present invention, the weakened layer is removed by an ultrasonic oscillation method.

In an embodiment of the present invention, the weakened layer is removed by a grinding/polishing method.

In an embodiment of the present invention, the grinding/polishing method includes removing the weakened layer with an abrasive slurry having a plurality of abrasive particles.

In an embodiment of the present invention, the abrasive particles include at least one of silicon dioxide, cesium oxide, aluminum oxide, silicon carbide, boron nitride and diamond, or a combination thereof.

In an embodiment of the present invention, the weakened layer is removed by a rapid-high temperature quenching method.

In an embodiment of the present invention, the weakened layer is removed by a laser ablation method.

In an embodiment of the present invention, the weakened layer is removed by a high-speed airflow cutting method.

In an embodiment of the present invention, the aforementioned substrate processing method further includes performing a surface treatment on the exposed surface.

In an embodiment of the present invention, the surface treatment is chemical mechanical polishing.

In an embodiment of the present invention, the weakened layer is porous.

In an embodiment of the present invention, the weakened layer is lamellar.

The present invention further provides a silicon carbide substrate processing method, including providing a silicon carbide substrate, wherein the silicon carbide substrate has a surface and a bottom surface opposite to each other, the silicon carbide substrate is defined with a predetermined area, the predetermined area is defined with a predetermined reaction part, and the predetermined reaction part extends from the surface toward the bottom surface of the silicon carbide substrate; contacting the predetermined reaction part to a hydrofluoric acid solution through anodization to perform an electrochemical method to convert the predetermined reaction part into a porous layer, wherein the porous layer has a thickness; and removing the porous layer so that the silicon carbide substrate in the predetermined area has an exposed surface.

The present invention converts the predetermined reaction part on the substrate into a weakened layer with an electrochemical method; thus, the weakened layer is porous or lamellar and has a hollow sponge-like or void-filled structure, which greatly reduces the material strength of the weakened layer, while the solid part on the substrate that has not undergone the anodization reaction still maintains the original high material strength. Therefore, in the subsequent manufacturing process, the weakened layer with lower material strength can be removed by methods such as grinding, rapid high-temperature quenching, laser ablation, high-speed airflow cutting or ultrasonic oscillation, etc. and the solid part remains. As a result, the thinned substrate can be obtained.

Furthermore, the electrochemical method of the present invention can be anodized, so the thickness of the weakened layer can be controlled by an amount of input charge when anodization is performed. Hence, it is possible to obtain a desired thickness of the weakened layer by controlling the current, voltage and time during anodization.

BRIEF DESCRIPTION OF THE DRAWINGS

The present invention will become more readily apparent to those ordinarily skilled in the art after reviewing the following detailed description and accompanying drawings, in which:

FIG. 1 is a schematic flowchart of a substrate processing method according to an embodiment of the present invention;

FIGS. 2A to 2C are cross-sectional schematic diagrams of a substrate in various steps of a substrate processing method according to an embodiment of the present invention;

DETAILED DESCRIPTION OF PREFERRED EMBODIMENTS

The present invention will now be described more specifically with reference to the following embodiments. It should be noted that the following descriptions of preferred embodiments of this invention are presented herein for purpose of illustration and description only. It is not intended to be exhaustive or to be limited to the precise form disclosed.

Figure 2C:
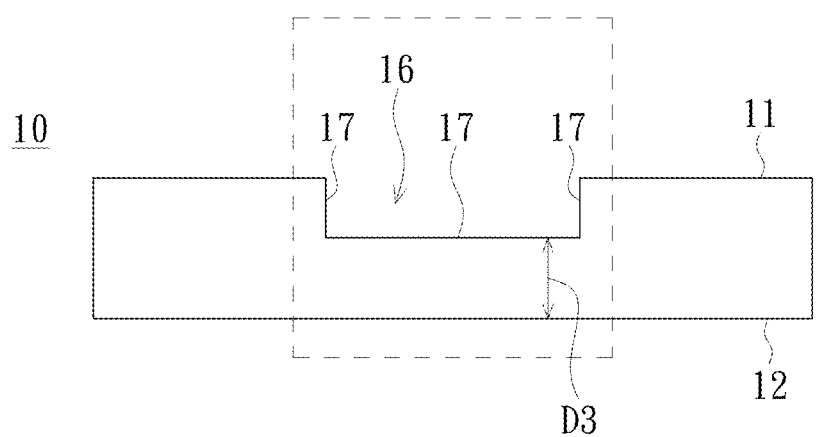
Figure 3:
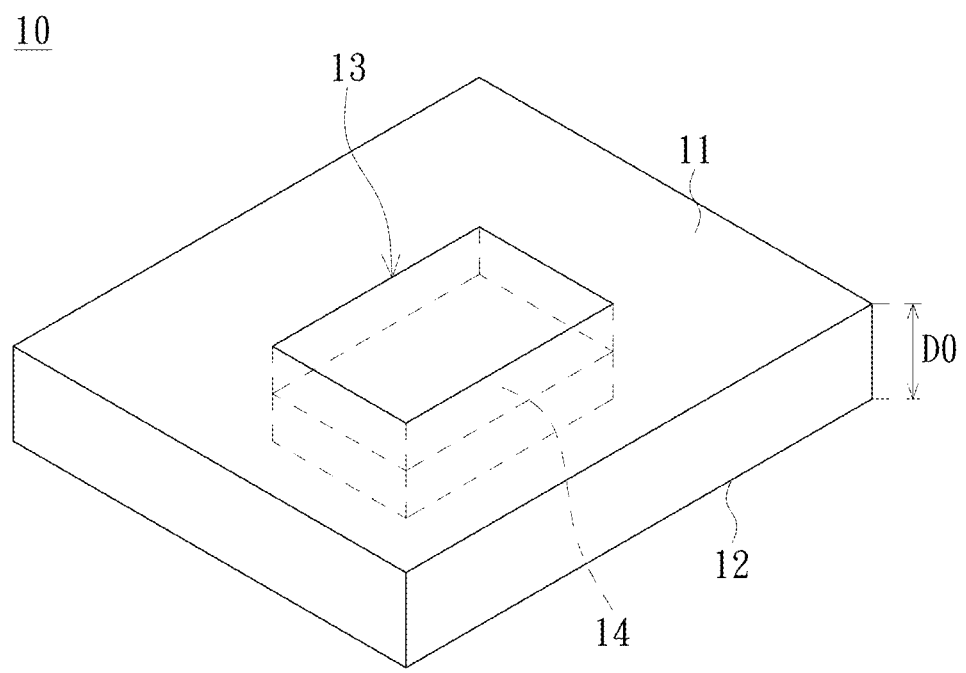
FIG. 3 is a three-dimensional schematic diagram of the substrate shown in FIG. 2A.

FIG. 1 is a schematic flowchart of a substrate processing method according to an embodiment of the present invention. FIGS. 2A to 2C are cross-sectional schematic diagrams of a substrate in various steps of a substrate processing method according to an embodiment of the present invention. As shown in FIG. 1, the substrate processing method according to an embodiment of the present invention includes steps S1 to S3. First, step S1: providing a substrate 10. FIG. 3 is a three-dimensional schematic diagram of the substrate shown in FIG. 2A. As shown in FIGS. 2A and 3, the substrate 10 has a surface 11 and a bottom surface 12 opposite to each other. The substrate 10 is defined with a predetermined area 13, the predetermined area 13 is defined with a predetermined reaction part 14, and the predetermined reaction part 14 extends from the surface 11 toward the bottom surface 12 of the substrate 10. In one embodiment, the material of the substrate 10 can be, for example, silicon carbide, but the invention is not limited thereto. The material of the substrate 10 can also be, for example, silicon, germanium, gallium arsenide, indium phosphide, gallium nitride, boron nitride, etc., which can be used as the material of the semiconductor substrate. The substrate 10 may have a thickness D0. In one embodiment, the predetermined area 13 is a portion of the substrate 10 to be processed. For example, the predetermined area 13 is an area of the substrate 10 to be thinned. The predetermined reaction part 14 is the part to be removed when the predetermined area 13 is to be thinned, and the predetermined reaction part 14 has, for example, a thickness D1.

Figure 4:
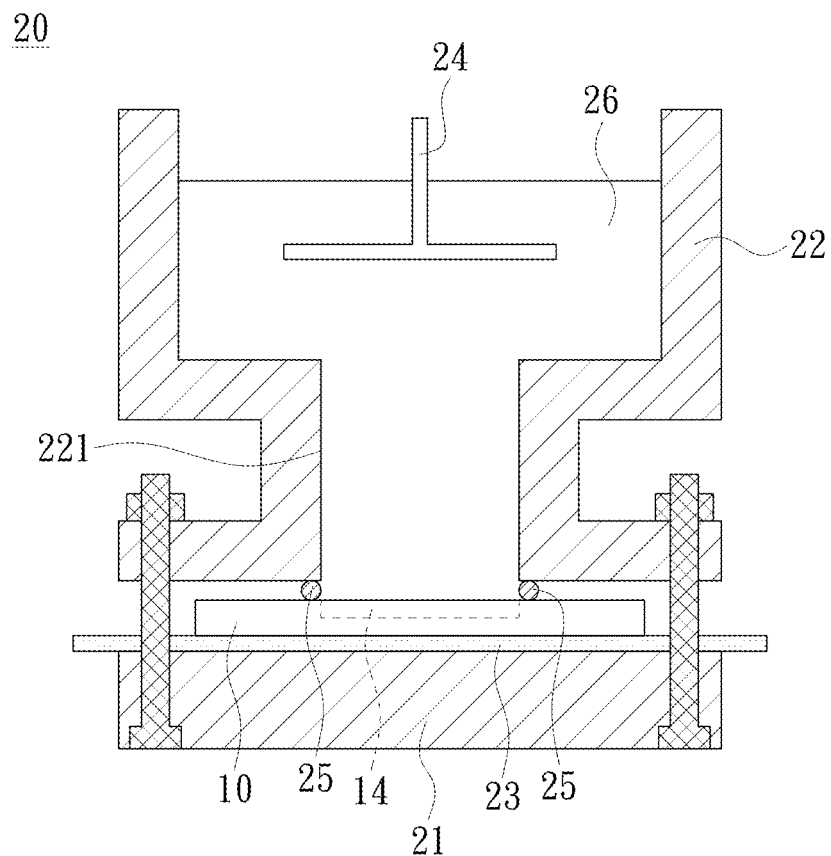
FIG. 4 is a cross-sectional schematic diagram of an electrochemical setup for performing an anodization reaction according to an embodiment of the present invention.

Then step S2: performing an anodization reaction on the predetermined reaction part 14 by an electrochemical method to convert the predetermined reaction part 14 into a weakened layer 15, wherein the weakened layer 15 has a thickness D2. Please refer to FIGS. 2B and 4 together. FIG. 4 is a cross-sectional schematic diagram of an electrochemical setup for performing an anodization reaction according to an embodiment of the present invention. The electrochemical setup shown in FIG. 4 is only used to illustrate the implementation of the present invention, but not to limit the scope of concepts of the present invention. In one embodiment, the electrochemical setup 20 may be an anodization device. As shown in FIG. 4, the electrochemical setup 20 includes a base 21 and a tank body 22. The base 21 and the tank body 22 can be fixed by bolts. The base 21 is provided with a positive electrode 23, and the material of the positive electrode 23 can be copper. A through hole 221 is formed at the bottom of the tank body 22, and an annular gasket 25 is arranged between the tank body 22 and the base 21 and corresponding to the periphery of the through hole 221.

When the substrate 10 is to be chemically reacted, the substrate 10 is disposed on the positive electrode 23 and electrically connected to the positive electrode 23, and the annular gasket 25 is adapted to abut the substrate 10. In one embodiment, the tank body 22 is filled with an electrolyte solution 26, and the electrolyte solution 26 flows out through the through hole 221 and flows to the substrate 10 within the restricted area by the annular gasket 25. In one embodiment, the shape and position of the annular gasket 25 correspond to those of the predetermined reaction part 14 of the predetermined area 13 of the substrate 10, so that the electrolyte solution 26 in the tank body 22 can be restricted by the annular gasket 25 to the area corresponding to the predetermined reaction part 14. Therefore the predetermined reaction part 14 can chemically react with the electrolyte solution 26 after the subsequent energization, and the substrate 10 outside the restricted area of the annular gasket 25 will not contact the electrolyte solution 26. A negative electrode 24 is disposed in the electrolyte solution 26 in the tank body 22, and the negative electrode 24 can be a platinum electrode. A voltage is applied to the substrate 10 when the positive electrode 23 and the negative electrode 24 are energized. At this time, the electrolyte solution 26 starts to perform the anodization reaction on the predetermined reaction part 14 adjacent to the surface 11 of the substrate 10. In one embodiment, the electrolyte solution 26 may contain fluoride ions from hydrofluoric acid (HF) or ammonium fluoride ($NH_4F$).

Following the above description, the electrolyte solution 26 is a hydrofluoric acid solution and the material of the substrate 10 is silicon carbide as an example. The silicon atoms of the silicon carbide will react with the fluorine in the hydrofluoric acid solution under bias to form fluosilicic acid dissolved or to form silicon tetrafluoride in electrolyte, so the most of the element remaining in the predetermined reaction part 14 is carbon after the anodization reaction. In addition, the weakened layer 15 having hollow sponge-like or void structure when the silicon at a specific position in the lattice is removed from the silicon carbide substrate 10. The weakened layer 15, including carbon frameworks and remaining silicon carbide, has a thickness D2. The thickness D2 of the weakened layer 15 is basically very close to the thickness D1 of the predetermined reaction part 14, and the thickness D2 is smaller than the thickness D0 of the substrate 10. The thickness D2 of the weakened layer 15 can be precisely controlled by adjusting the amount of input charges to change the number of atoms removed during the anodization reaction according to Faraday's laws of electrolysis. The amount of input charges can be controlled by adjusting the current or voltage applied to the substrate 10 or the anodization reaction time.

Figure 5A:
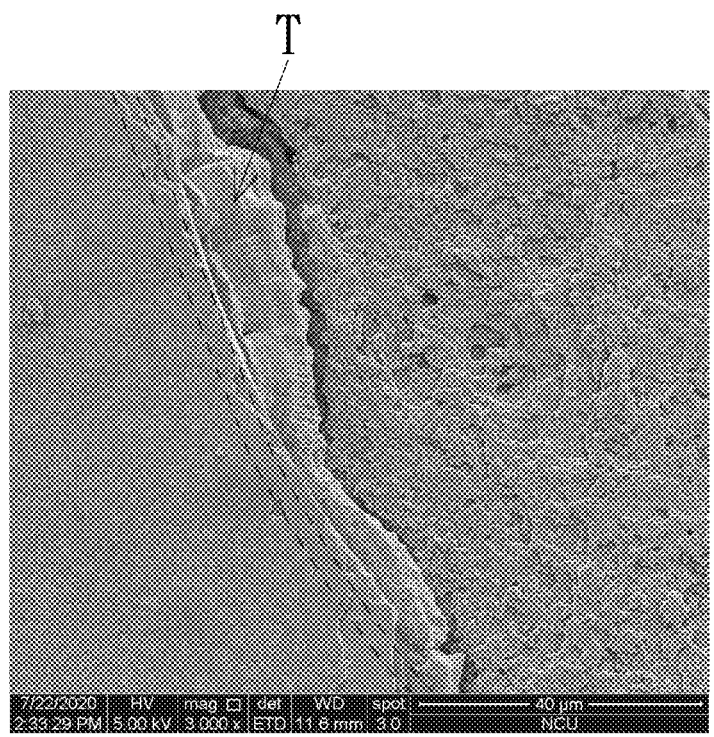
FIG. 5A is a photo of a weakened layer processed by a substrate processing method according to an embodiment of the present invention photographed by a scanning electron microscopy (SEM)
Figure 5B:
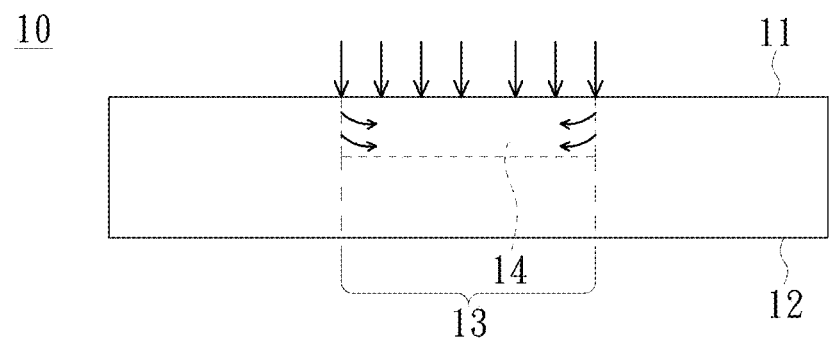
FIG. 5B is a schematic diagram showing the direction of the intrusion of the electrolyte solution into the predetermined reaction part during the anodization reaction of the substrate processing method according to an embodiment of the present invention.
Figure 6:
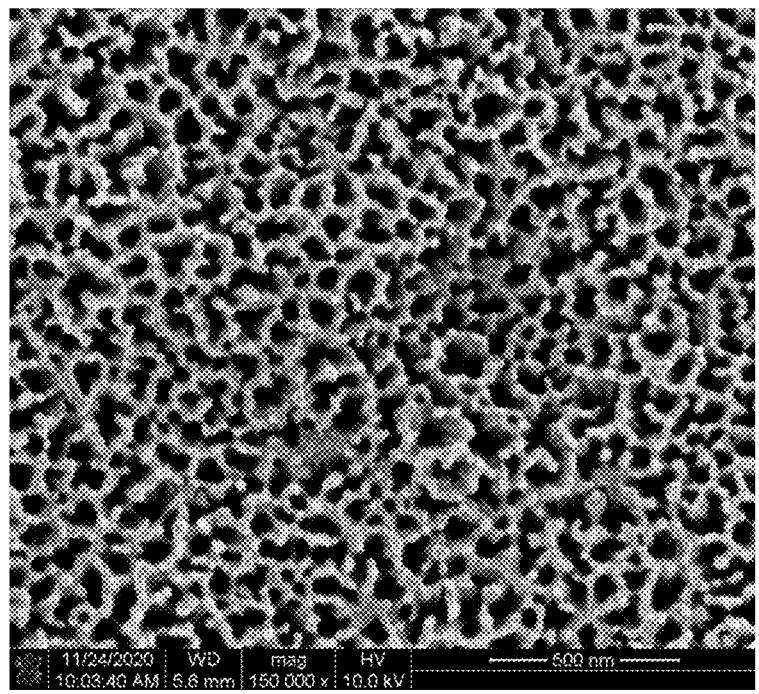
FIG. 6 is a photo of a weakened layer according to an embodiment of the present invention photographed by a scanning electron microscope (SEM)

Please refer to FIGS. 5A, 5B and 6. FIG. 6 is a photo of a weakened layer processed by a substrate processing method according to an embodiment of the present invention photographed by a scanning electron microscope (SEM). FIG. 5B is a schematic diagram showing the direction of the intrusion of the electrolyte solution into the predetermined reaction part during the anodization reaction of the substrate processing method according to an embodiment of the present invention. Specifically, FIG. 5A is a photo of a weakened layer processed by a substrate processing method according to an embodiment of the present invention photographed by a scanning electron microscope (SEM) at a magnification of 3,000 times. The area marked by the dashed line in FIG. 5A is the position where the annular gasket 25 is pressed against the substrate 10 during the anodization reaction. Because the stress is concentrated on the position, in addition starting to perform the anodization reaction on the predetermined reaction part 14 adjacent to the surface 11 of the substrate 10, the electrolyte solution 26 also erodes downward at the stress concentration point and then intrude laterally toward the center of the predetermined reaction part 14 to perform the anodization reaction (as shown in FIG. 5B). The area indicated by an arrow as shown in FIG. 5A is the trace T of the electrolyte solution 26 laterally intruding into the center of the predetermined reaction part 14. Therefore, the weakened layer 15 is lamellar as shown in FIG. 5A. Please refer to FIGS. 2A to 2C and 6. FIG. 6 is a photo of a weakened layer according to an embodiment of the present invention photographed by a scanning electron microscope (SEM) at a magnification of 150,000 times. At this magnification, a plurality of holes in the aforementioned lamellar weakened layer 15 can be clearly seen. The holes are formed in the remaining carbon structure when silicon at a specific position in the silicon carbide lattice is removed from the silicon carbide substrate 10. The material strength of the weakened layer 15 having hollow sponge-like structure is greatly reduced than that of the solid silicon carbide substrate 10, so that it can be easily removed in the subsequent manufacture process. In one embodiment, the weakened layer 15 is a porous layer.

Refer to FIG. 1. After the predetermined reaction part 14 of the substrate 10 is converted into the weakened layer 15, then step S3: removing the weakened layer 15 so that the predetermined area 13 of the substrate 10 has an exposed surface 17. In the step S3 of removing the weakened layer 15 as shown in FIGS. 2B and 2C, because the material strength of the weakened layer 15 is very different from that of the solid substrate 10, a general grinding method or an ultrasonic oscillation method can be used to fragment the weakened layer 15 without affecting the solid part of the substrate 10 (i.e., the part that is not performed the anodization reaction), so as to removed the weakened layer 15 from the substrate 10. In this embodiment, using either a grinding method or an ultrasonic oscillation method can achieve the effect of crushing the weakened layer 15; however, the present invention is not limited thereto. A grinding method and an ultrasonic oscillation method can also be used in step S3 together, and the order in which the grinding method and the ultrasonic oscillation method are used is not limited. In the above-mentioned embodiment, the grinding method may include removing the weakened layer 15 with an abrasive slurry having a plurality of abrasive particles. The abrasive particles may include, for example, at least one of silicon dioxide, cesium oxide, aluminum oxide, silicon carbide, boron nitride and diamond, or a combination thereof. In another embodiment, the weakened layer 15 can also be removed by a rapid high-temperature quenching method, a laser cutting method or a high-speed airflow cutting method.

Follow the above description. After the weakened layer 15 is removed, a groove 16 having a shape corresponding to the predetermined reaction part 14 is formed in the predetermined area 13 of the substrate 10 (as shown in FIG. 2C). The groove 16 has the exposed surface 17. The thickness from the bottom of the groove 16 to the bottom surface 12 of the substrate 10 is D3, and the thickness D3 is smaller than the thickness D0 of the substrate 10. In an embodiment of the present invention, the weakened layer 15 is shredded by a grinding method or an ultrasonic method, the shredded fragments are removed, and the solid part in the predetermined area 13 of the substrate 10 is retained, so as to quickly achieve the thinning of the predetermined area 13 of the substrate 10.

Figure 7A:
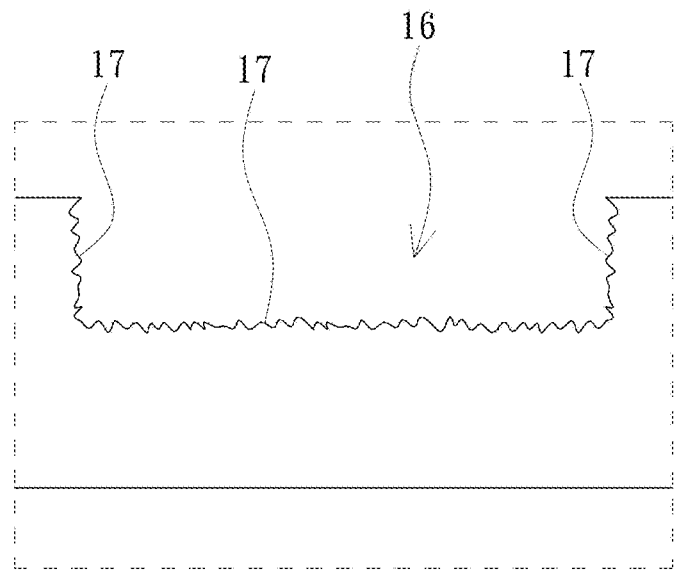
FIG. 7A is an enlarged schematic diagram of the dotted rectangle shown in FIG. 2C.
Figure 7B:
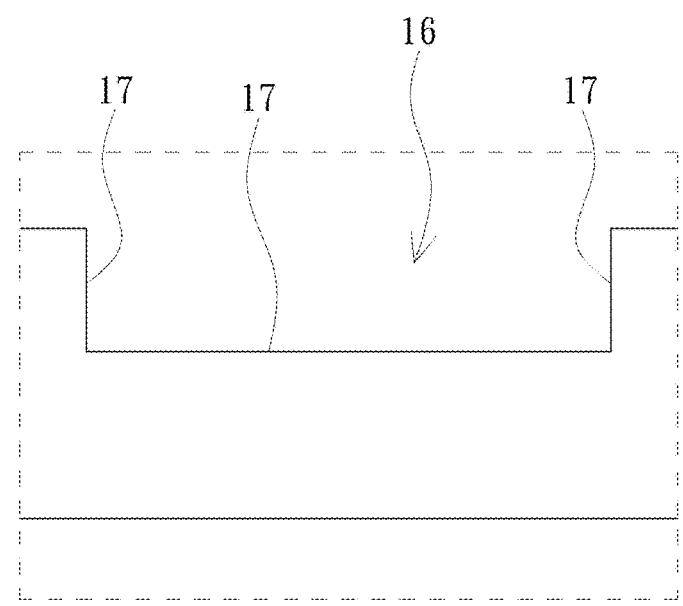
FIG. 7B is a schematic diagram of the substrate with the groove shown in FIG. 7A after surface treatment.

FIG. 7A is an enlarged schematic diagram of the dotted rectangle shown in FIG. 2C, and FIG. 7B is a schematic diagram of the substrate with the groove shown in FIG. 7A after surface treatment. In one embodiment, the substrate processing method of the present invention may further include performing surface treatment on the exposed surface 17 of the groove 16. As shown in FIG. 7A, the groove 16 is formed by crushing the weakened layer 15 and removing the crushed fragments. Therefore, the exposed surface 17 of the groove 16 may contain particles or protrusions after the crushing, resulting in an uneven exposed surface 17. Thus, the exposed surface 17 can be flattened by surface treatment as shown in FIG. 7B, wherein the surface treatment can be a flattening process such as chemical mechanical polishing. In one embodiment, the surface treatment may use abrasive slurry containing abrasive particles to perform flattening, wherein the particle size of the abrasive particles used for flattening is smaller than that of the abrasive particles used for removing the weakened layer 15. The particle size of the abrasive particles used for flattening can be, for example, nanometer or angstrom scale, and the particle size of the abrasive particles used for removing the weakened layer 15 can be, for example, micron scale. In one embodiment, the surface treatment may further include another polishing process adopted after the exposed surface is flattened, and the another polishing process may be chemical mechanical polishing. However, the present invention is not limited thereto. The polishing process adopted after the exposed surface is flattened may be other manufacture processes such as microetch, plasma treatment and ion beam surface treatment.

In an embodiment not shown, when the predetermined area 13 to be thinned is the entire surface 11 of the substrate 10, the annular gasket 25 of the electrochemical setup 20 may be pressed against the periphery of the surface 11 of the substrate 10 or pressed against the side surface of the substrate 10 in step S2, so that the entire surface 11 of the substrate 10 is contacted with the electrolyte solution 26 for the anodization reaction to form an entire weakened layer 15. In this embodiment, the groove 16 is not formed after removing the weakened layer 15 in step S3, while there is still a rough exposed surface 17 after the weakened layer 15 is removed.

Figure 8:
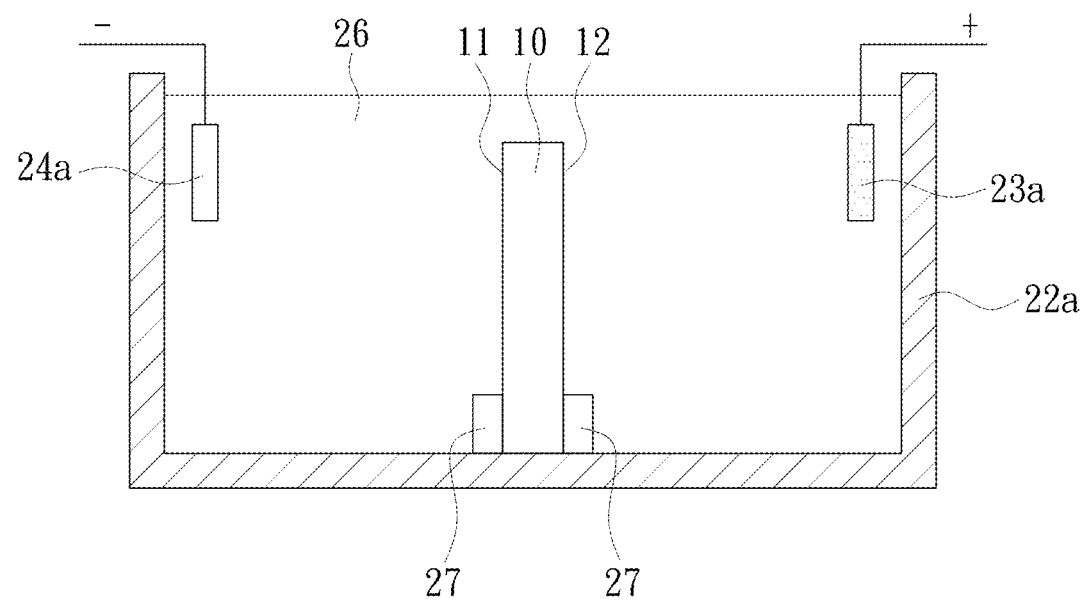
FIG. 8 is a cross-sectional schematic diagram of an electrochemical setup for performing anodization reactions according to another embodiment of the present invention.

Please refer to FIG. 8. FIG. 8 is a cross-sectional schematic diagram of an electrochemical setup for performing the anodization reactions according to another embodiment of the present invention. In one embodiment, the anodization reaction can be performed with the electrochemical setup of FIG. 8 when the predetermined area 13 to be thinned is the entire surface 11 of the substrate 10. As shown in FIG. 8, the electrochemical setup 20*a* includes a tank body 22*a*. The tank body 22*a* is filled with an electrolyte solution 26. Two brackets 27 are arranged at the bottom of the tank body 22*a*. The brackets 27 are used to fix the substrate 10 to be subjected to the electrochemical reaction. The substrate 10 can divide the tank body 22*a* into two tanks when the substrate 10 is fixed between the two brackets 27, wherein one of the two tanks is provided with a positive electrode 23*a*, and the other one of the two tanks is provided with a negative electrode 24*a*. The positive electrode 23*a* and the negative electrodes 24*a* do not contact the bottom surface 12 and the surface 11 of the substrate 10, respectively. The materials of the positive electrode 23*a* and the negative electrode 24*a* can be the same as those of the positive electrode 23 and the negative electrode 24 in the above-mentioned embodiments, respectively. The entire substrate 10 is immersed in the electrolyte solution 26 when the positive electrode 23*a* and the negative electrode 24*a* are connected to a power supply for electrochemical treatment, and therefore a weakened layer 15 is formed on the entire surface 11 facing the negative electrode 24*a*. In this embodiment, the groove 16 is not formed after removing the weakened layer 15 in step S3, but there is still a rough exposed surface 17 after the weakened layer 15 is removed.

The present invention converts the predetermined reaction part of the predetermined area on the substrate into a weakened layer with an electrochemical method. Based on the difference in material strength between the weakened layer and the solid part on the substrate that has not undergone the anodization reaction, the weakened layer with lower material strength can be easily fragmented by means of grinding, ultrasonic oscillation, etc. and the solid part in the predetermined area of the substrate is retained, which can quickly achieve rapid thinning of the predetermined area of the substrate. Therefore, the cracking or warping of the substrate material caused by the high stress introduced by the conventional hard cutting method can be avoided, and the problem that the substrate material is too strong to be thinned by the general grinding method can be overcome.

Furthermore, the electrochemical method of the present invention can change the current, voltage and time during the anodization reaction according to Faraday's laws of electrolysis to control the amount of input charges, thereby obtaining the desired thickness of the weakened layer. Therefore, the depth of the groove formed in the predetermined area of the substrate (i.e., the thickness of the removed weakened layer) can be precisely adjusted.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A substrate processing method, comprising:
   providing a substrate, wherein the substrate has a surface and a bottom surface opposite to each other, the substrate is defined with a predetermined area, the predetermined area is defined with a predetermined reaction part, and the predetermined reaction part extends from the surface toward the bottom surface of the substrate;
   performing an anodization reaction on the predetermined reaction part to convert the predetermined reaction part into a weakened layer, wherein the weakened layer has a thickness; and
   removing the weakened layer so that the substrate in the predetermined area has an exposed surface, wherein the weakened layer is removed by a quenching method.

2. The substrate processing method according to claim 1, wherein a material of the substrate is silicon carbide.

3. The substrate processing method according to claim 1, wherein the thickness of the weakened layer is controlled by an amount of input charges in anodization.

4. The substrate processing method according to claim 1, wherein the predetermined reaction part contacts an electrolyte solution during the anodization, and the electrolyte solution comprises fluorine ions.

5. The substrate processing method according to claim 4, wherein the electrolytic solution is a hydrofluoric acid solution.

6. The substrate processing method according to claim 1, further comprising performing a surface treatment on the exposed surface.

7. The substrate processing method according to claim 6, wherein the surface treatment is chemical mechanical polishing.

8. The substrate processing method according to claim 1, wherein the weakened layer is porous.

9. The substrate processing method according to claim 1, wherein the weakened layer is lamellar.

10. A substrate processing method, comprising:
    providing a substrate, wherein the substrate has a surface and a bottom surface opposite to each other, the substrate is defined with a predetermined area, the predetermined area is defined with a predetermined reaction part, and the predetermined reaction part extends from the surface toward the bottom surface of the substrate;
    performing an anodization reaction on the predetermined reaction part to convert the predetermined reaction part into a weakened layer, wherein the weakened layer has a thickness; and
    removing the weakened layer so that the substrate in the predetermined area has an exposed surface, wherein the weakened layer is removed by an airflow cutting method.

11. The substrate processing method according to claim 10, wherein a material of the substrate is silicon carbide.

12. The substrate processing method according to claim 10, wherein the thickness of the weakened layer is controlled by an amount of input charges in anodization.

13. The substrate processing method according to claim 10, wherein the predetermined reaction part contacts an electrolyte solution during the anodization, and the electrolyte solution comprises fluorine ions.

14. The substrate processing method according to claim 13, wherein the electrolytic solution is a hydrofluoric acid solution.

15. The substrate processing method according to claim 10, further comprising performing a surface treatment on the exposed surface.

16. The substrate processing method according to claim 15, wherein the surface treatment is chemical mechanical polishing.

17. The substrate processing method according to claim 10, wherein the weakened layer is porous.

18. The substrate processing method according to claim 10, wherein the weakened layer is lamellar.

\* \* \* \* \*